United States Patent
Gaidis et al.

(10) Patent No.: US 7,133,309 B2
(45) Date of Patent: Nov. 7, 2006

(54) METHOD AND STRUCTURE FOR GENERATING OFFSET FIELDS FOR USE IN MRAM DEVICES

(75) Inventors: Michael C. Gaidis, Wappingers Falls, NY (US); Philip L. Trouilloud, Norwood, NJ (US)

(73) Assignee: International Business Machines Corporation, Armonk, NY (US)

( * ) Notice: Subject to any disclaimer, the term of this patent is extended or adjusted under 35 U.S.C. 154(b) by 26 days.

(21) Appl. No.: 10/905,541

(22) Filed: Jan. 10, 2005

(65) Prior Publication Data

US 2006/0154381 A1    Jul. 13, 2006

(51) Int. Cl.
*G11C 11/00* (2006.01)

(52) U.S. Cl. .................. 365/158; 365/171; 365/173; 257/427

(58) Field of Classification Search ............ 365/158, 365/171, 173; 257/427
See application file for complete search history.

(56) References Cited

U.S. PATENT DOCUMENTS

| | | | |
|---|---|---|---|
| 6,522,573 B1 * | 2/2003 | Saito et al. ............ | 365/158 |
| 6,545,906 B1 | 4/2003 | Savtchenko et al. | |
| 6,633,498 B1 | 10/2003 | Engel et al. | |
| 6,865,109 B1 * | 3/2005 | Covington ............ | 365/173 |
| 2005/0253128 A1 | 11/2005 | Worledge | |
| 2005/0274997 A1 | 12/2005 | Gaides et al. | |

OTHER PUBLICATIONS

M. Durlam et al.; "A 0.18um 4Mb Toggling MRAM;" IEEE 2003.
W. Reohr et al.; "Memories of Tomorrow;" IEE Circuits & Devices Magazine, Sep. 2002, pp. 17-27.
D.C. Worledge, "Spin Flop Switching For Magnetic Random Access Memory", Applied Physics Letters, vol. 84, No. 22, May 31, 2004, pp. 4559-4561.

* cited by examiner

*Primary Examiner*—Anh Phung
*Assistant Examiner*—Allison Bernstein
(74) *Attorney, Agent, or Firm*—Cantor Colburn LLP

(57) ABSTRACT

A method for generating an offset field for a magnetic random access memory (MRAM) device includes forming a first pinned layer integrally with a wordline, and forming a second pinned layer integrally with a bitline. An MRAM cell is disposed between the wordline and the bitline, the MRAM cell including a reference layer, an antiparallel free layer and a tunnel barrier therebetween. The first pinned layer is formed with an internal magnetization in a manner so as to create a first external field generally perpendicular to a long axis of the wordline, and the second pinned layer is formed with an internal magnetization in a manner so as to create a second external field generally perpendicular to a long axis of the bitline.

26 Claims, 7 Drawing Sheets

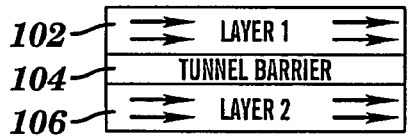
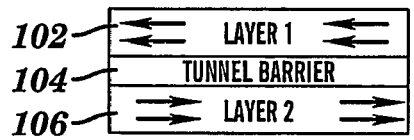
FIG. 1(a)         FIG. 1(b)
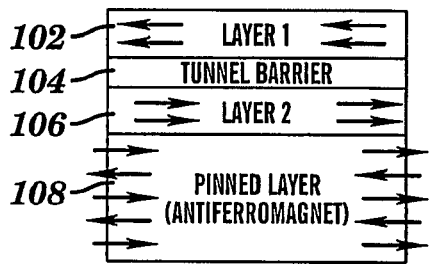
FIG. 1(c)
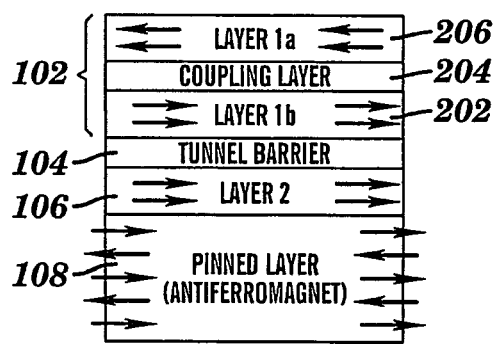
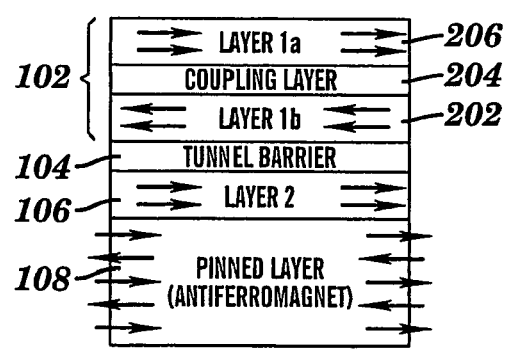
LOW-RESISTANCE STATE         HIGH-RESISTANCE STATE
FIG. 2(a)         FIG. 2(b)

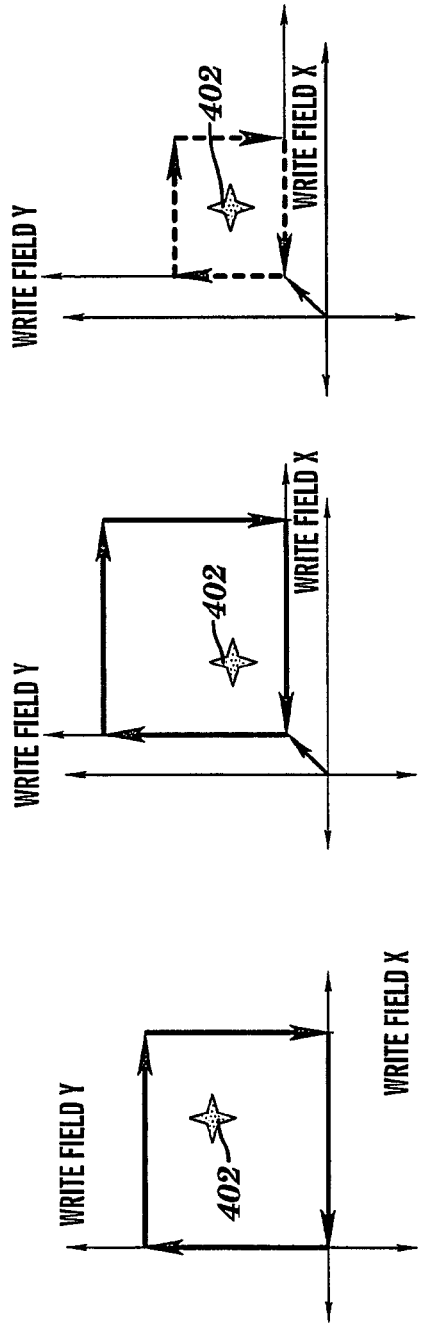
FIG. 4(c)
FIG. 4(b)
FIG. 4(a)
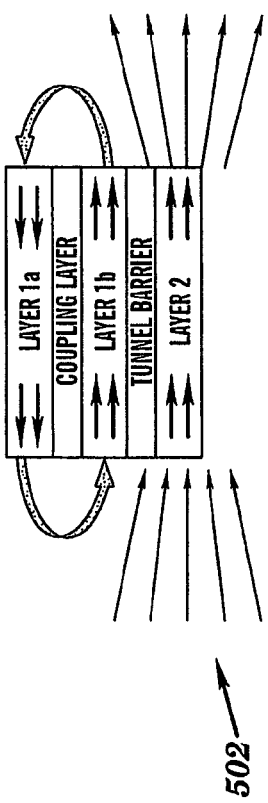
FIG. 5

METHOD AND STRUCTURE FOR GENERATING OFFSET FIELDS FOR USE IN MRAM DEVICES

BACKGROUND

The present invention relates generally to magnetic random access memory devices, and, more particularly, to a method and structure for offsetting the spin-flop point of a toggling MRAM device for reduced power consumption.

Magnetic (or magneto-resistive) random access memory (MRAM) is a non-volatile random access memory technology that could replace the dynamic random access memory (DRAM) as the standard memory for computing devices. The use of MRAM as a non-volatile RAM would allow for "instant on" systems that come to life as soon as the system is turned on, thus saving the amount of time needed for a conventional PC, for example, to transfer boot data from a hard disk drive to volatile DRAM during system power up.

A magnetic memory element (also referred to as a tunneling magneto-resistive, or TMR device) includes a structure having ferromagnetic layers separated by a non-magnetic layer (barrier), and arranged into a magnetic tunnel junction (MTJ). Digital information is stored and represented in the memory element as directions of magnetization vectors in the magnetic layers. More specifically, the magnetic moment of one magnetic layer (also referred to as a reference layer) is maintained in a preassigned direction, while the magnetic moment of the magnetic layer on the other side of the tunnel barrier (also referred to as a "free" layer) may be switched during operation between the same direction and the opposite direction with respect to the fixed magnetization direction of the reference layer. The orientations of the magnetic moment of the free layer adjacent to the tunnel junction are also known as "parallel" and "antiparallel" states, wherein a parallel state refers to the same magnetic alignment of the free and reference layers, while an antiparallel state refers to opposing magnetic alignments therebetween.

Depending upon the magnetic state of the free layer (parallel or antiparallel), the magnetic memory element exhibits two different resistance values in response to a voltage applied across the tunnel junction barrier. The particular resistance of the TMR device thus reflects the magnetization state of the free layer, wherein resistance is typically "low" when the magnetization is parallel, and "high" when the magnetization is antiparallel. Accordingly, a detection of changes in resistance allows a MRAM device to provide information stored in the magnetic memory element (i.e., a read operation). There are different methods for writing a MRAM cell; for example, a Stoner-Wohlfarth astroid MRAM cell is written to through the application of fields to exceed a critical curve or stability threshold, in order to magnetically align the free layer in a parallel or antiparallel state. The free layer is fabricated to have a preferred axis for the direction of magnetization called the "easy axis" (EA), and is typically set by a combination of intrinsic anisotropy, strain induced anisotropy, and shape anisotropy of the MTJ.

When a sufficiently large current is passed through both a wordline and a bitline of the MRAM, the combined fields of these currents at the intersection of the write and bit lines will switch the magnetization of the free layer of the particular MTJ located at the intersection of the energized write and bit lines. The current levels are selected such that the combined fields exceed the switching threshold of the free layer. For a Stoner-Wohlfarth astroid MRAM structure, the EA is aligned with the orientation of either the bitline or the wordline.

As the lateral dimension of an MRAM device decreases, several problems can occur. First, the switching field increases for a given shape and film thickness, thus requiring a larger magnetic field for switching. Second, the total switching volume is reduced such that the energy barrier for reversal also decreases, wherein the energy barrier refers to the amount of energy needed to switch the magnetic moment vector from one state to the other. The energy barrier determines the data retention and error rate of the MRAM device, and thus unintended reversals can occur due to thermal fluctuations if the barrier is too small. Furthermore, with a small energy barrier it becomes extremely difficult to selectively switch a single MRAM device in an array without inadvertently switching other MRAM devices. Thirdly, the shape anisotropy becomes dominant and the switching field becomes more sensitive to shape variations as the MRAM devices decreases in size.

In this regard, there has been introduced an MRAM device in which the free layer of ferromagnetic material includes multiple (e.g., two) ferromagnetic layers separated by a nonmagnetic coupling layer. Due to magnetostatic coupling, the magnetic moments of the two ferromagnetic layers are antiparallel to one another. This configuration allows for a different method of writing that improves selectivity. An exemplary configuration aligns the axis of intrinsic magnetic anisotropy at a 45° angle with respect to the orientation of the word and bitlines. The device can be patterned to include shape anisotropy, and in an exemplary configuration is also aligned at a 45° angle with respect to the orientation of the word and bitlines.

More specifically, the writing method relies on a toggle or "spin-flop" phenomenon that gently rotates the magnetic moment vectors of the two ferromagnetic layers so they exchange directions. In the X-Y field plane, the fields follow a closed trajectory or "toggle-box" that encloses a critical point called the spin-flop point. The magnitudes of the required fields are dependent on the location of this spin-flop point. Current waveforms applied to the wordline and bitline in a timed sequence induce a magnetic field trajectory which reliably toggles the state of the multifilm free layer, such that the magnetization of the film closest to the tunnel barrier will switch direction (i.e., "toggle"), and at remanence the partner film in the free layer maintains an antiparallel magnetization to the aforementioned film. Reduction in power consumption may be attainable by moving the spin flop point closer to the origin of the wordline and bitline field graph so as to decrease the size of the "toggle box" around the spin flop point, and thus decreasing the magnitude of the applied write current in the bitline and wordline.

Another issue related to the manufacture of MRAM devices is the relationship of the pinned layers to the reference layer. State of the art MRAM devices utilize an antiferromagnet coupled tightly to a ferromagnet to form a pinned layer "stack" that couples tightly to the reference layer. Antiferromagnets for the pinned layer are most often comprised of materials such as IrMn or PtMn, and their incorporation adjacent to the sensitive magnetics of the MRAM device presents certain manufacturing challenges. The galvanic properties of the noble metal-like (Ir or Pt-containing) material, and the out-diffusion of certain elements (e.g., manganese) in the materials can result in device degradation. At certain processing steps in the patterning of the devices, large areas of the noble metal-like antiferromagnet may be exposed, and can drive harmful corrosive reactions with the sensitive magnetic films near the tunnel barrier. In addition, during thermal processing of an MRAM device, device degradation due to diffusion of, for example, manganese through the reference layer and into the tunnel barrier and nearby magnetic films can degrade device performance and thus will limit the temperature to which the devices can be exposed. This limits the choice of materials that can be utilized near the device, as processing temperatures (e.g., for standard PECVD dielectrics or final device packaging) can be high enough to destroy the device through outdiffusion of pinned-layer elements. Thus, additional manufacturing benefits could be obtained by inhibiting the diffusion of antiferromagnetic material from a pinned layer into a tunnel barrier and nearby magnetic films and by processing materials which drive strong galvanic reactions at times when the sensitive tunnel barrier and nearby magnetic films are not present or exposed.

Accordingly, it would be desirable to be able to manufacture an MRAM device such that the reference layer is properly aligned during "read" operations, wherein the "spin-flop" point is desirably shifted towards the origin of the wordline and bitline field graph, and wherein the device inhibits diffusion of antiferromagnetic material from one or more pinned layers with respect to the tunnel barrier(s) and nearby magnetic films. Furthermore, it is desirable to be able implement the formation of such a device (addressing both power consumption concerns and pinned layer diffusion) in a practical manner.

SUMMARY

The foregoing discussed drawbacks and deficiencies of the prior art are overcome or alleviated by a method for generating an offset field for a magnetic random access memory (MRAM) device. In an exemplary embodiment, the method includes forming a first pinned layer integrally with a wordline, and forming a second pinned layer integrally with a bitline. An MRAM cell is disposed between the wordline and the bitline, the MRAM cell including a reference layer, an antiparallel free layer and a tunnel barrier therebetween. The first pinned layer is formed with an internal magnetization in a manner so as to create a first external field generally perpendicular to a long axis of the wordline, and the second pinned layer is formed with an internal magnetization in a manner so as to create a second external field generally perpendicular to a long axis of the bitline.

In another embodiment, a magnetic random access memory (MRAM) device includes a first pinned layer integrally formed with a wordline, a second pinned layer integrally formed with a bitline, and an MRAM cell disposed between the wordline and the bitline. The MRAM cell includes a reference layer, an antiparallel free layer and a tunnel barrier therebetween. The first pinned layer is formed with an internal magnetization in a manner so as to create a first external field generally perpendicular to a long axis of the wordline, and the second pinned layer is formed with an internal magnetization in a manner so as to create a second external field generally perpendicular to a long axis of the bitline.

BRIEF DESCRIPTION OF THE DRAWINGS

Referring to the exemplary drawings wherein like elements are numbered alike in the several Figures:

FIGS. 1(a) and 1(b) illustrate a conventional configuration for an MRAM device having a free layer, tunnel barrier and reference layer;

FIG. 1(c) illustrates an antiferromagnetic pinning layer in conjunction with the MRAM device of FIGS. 1(a) and 1(b);

FIGS. 2(a) and 2(b) illustrate a toggle-mode MRAM device in which the free layer includes a combination of three films;

FIGS. 4(a) through 4(c) are graphs illustrating the toggle mode of MRAM switching with respect to the applied field in X and Y directions and a spin-flop point;

FIG. 5 schematically illustrates the coupling of the reference layer to an external field;

DETAILED DESCRIPTION

Figure 3:
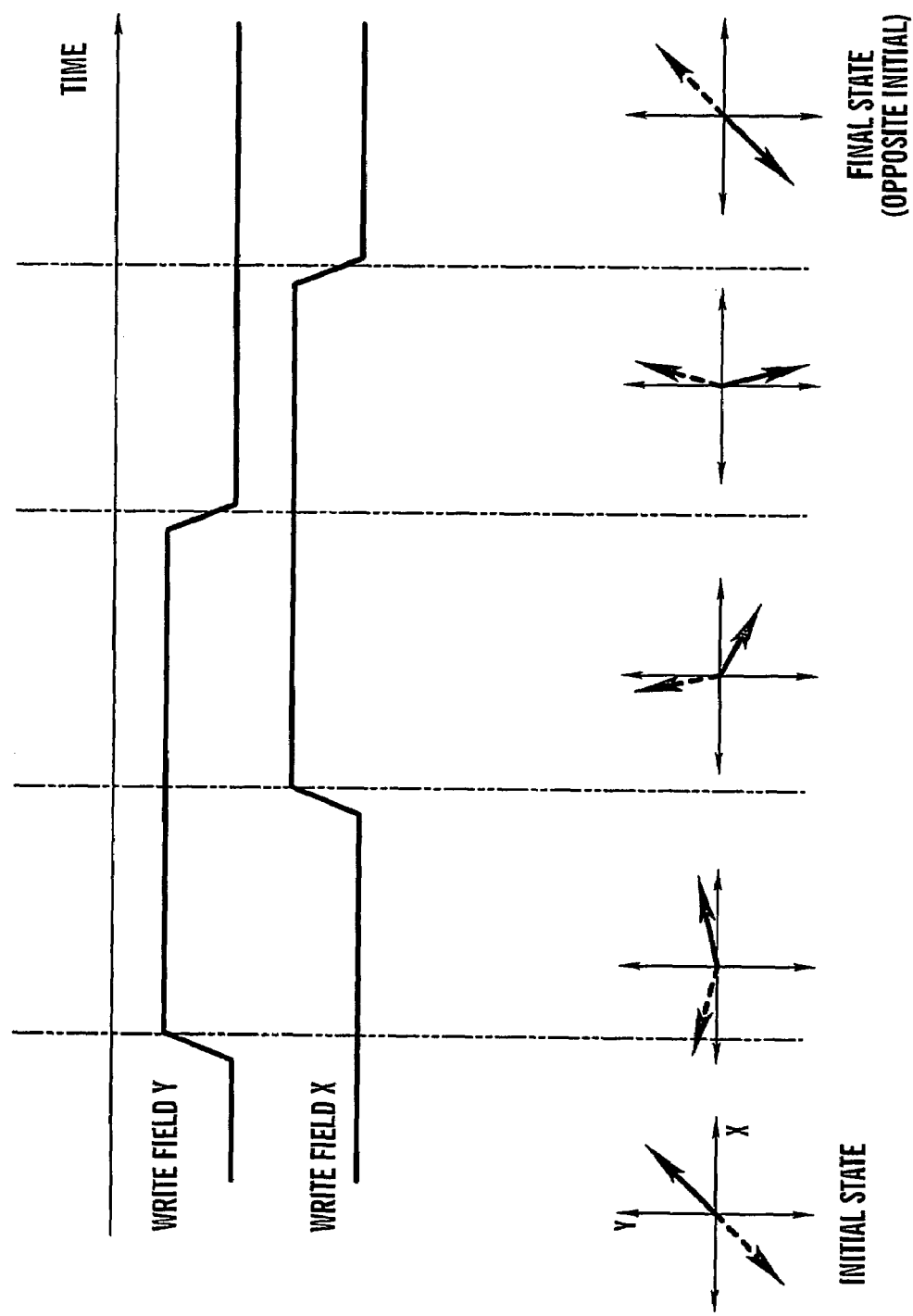
FIG. 3 illustrates a timing diagram and corresponding direction of magnetization for an exemplary operation of a write cycle applied to a toggle-mode MRAM device, wherein the dotted and solid vectors in the X-Y plot represent the magnetization direction of the two different magnetic films in a toggle-mode free layer.

Disclosed herein is an MRAM device and method of manufacturing thereof in which the formation of a pinned layer is incorporated into the formation of the wordlines and bitlines, thus eliminating the need for extra lithography steps and complex processing. The physical separation of the pinned layer(s) from the sensitive tunnel barrier(s) inhibits the diffusion of manganese (for example) into the tunnel barrier during high temperature processing steps, and reduces the chance of harm caused by galvanic corrosion originating in noble metal-like pinned layer materials. Moreover, the disposition of the pinned layers in both wordline and bitline axes may be used to create demagnetization fields that are perpendicular to the long axis of the wires in which the pinned layers reside. In one embodiment, the magnetization of both pinned layers can be set at the same time, thus enhancing the manufacturability of the device. In addition, by superposition of the fields from these two pinned layers, a 45 degree offset field (e.g., relative to the bitline at or near the free layer) is created, thereby adjusting the spin-flop point closer to the origin for reduced switching power. Still a further advantage of this offset field is the stabilizing force produced thereby, which allows the reference layer to be separated from the pinning layer.

As is further discussed herein after, the superposition of the fields from the pinned bitline and wordline layers nominally results in a 45 degree offset field at one plane approximately equidistant between the bitline and wordline layers. However, free layers located above or below this equidistant 45 degree plane are subject to offset fields that shift the spin-flop point in other directions (besides along the 45 degree axis). Thus, in other embodiments contemplated herein, this effect may be utilized to enable the individual writing of two or more bits per cell, without the need for adding any extra write wires.

By way of further introduction of the advantages of the embodiments disclosed hereinafter, FIGS. 1(a) and 1(b) illustrate a conventional configuration for an MRAM device 100 having a free layer 102 (layer 1), tunnel barrier 104 and reference layer 106 (layer 2). FIG. 1(a) depicts the low resistance (parallel) state of the device 100, wherein the magnetization of layer 1 is in the same direction as the magnetization of layer 2. Current flows across the tunnel barrier 104 between layers 1 and 2 during a read operation of the cell. The high resistance (antiparallel) state is shown in FIG. 1(b), wherein the magnetization of layer 1 is opposite that of layer 2.

A problem arises when attempting to apply an external magnetic field to flip the direction of magnetization of one layer, but not affect the other layer. Unless there is some imbalance in the writing (or "flipping") process, both layers will align parallel to an applied external magnetic field, and thus the low resistance state will continue to be detected. To overcome this elementary problem, an MRAM manufacturer attempts to "pin" one of the layers (e.g., reference layer 106) so that it does not change magnetization direction when an external magnetic field is applied to flip the unpinned, free layer 102. (It will be appreciated that layer 1 could serve as the pinned layer, while layer 2 could serve as the free layer.)

A simple method of pinning would be to make layer 2 significantly thicker than layer 1, so that a much greater amount of energy is needed to flip the magnetization thereof. Unfortunately, the added thickness needed to keep layer 2 "pinned" is impractical from a manufacturing and operational standpoint, and as such, a more practical solution has been to add an antiferromagnetic (pinning) layer 108 beneath the reference (pinned) layer 106, as illustrated in FIG. 1(c). The antiferromagnetic layer 108 is tightly coupled with the reference layer 106 so as to fix its magnetization. Since external fields used to switch the magnetization direction of the free layer 102 do not affect the antiferromagnet layer 108, and since the coupling between the antiferromagnet layer 108 and the reference layer 106 is much stronger than the energy being used to switch the magnetization direction, the reference layer 106 remains pinned. The antiferromagnet layer 108 in this configuration is therefore referred to as the "pinned" layer because it does not change state, but instead determines the direction of the reference layer magnetization.

As further indicated previously, Savtchenko, et al. developed an alternative design for the free layer incorporating two (or more) separate magnetic layers, spaced apart by a nonmagnetic third layer. Further information in this regard is disclosed in U.S. Pat. No. 6,545,906, the contents of which are incorporated herein in their entirety. Certain advantages of this design include reduced dipole coupling of devices to near neighbor devices, and also reduced write currents needed to flip the direction of free layer magnetization. The write current is reduced through the use of what is generally referred to as "toggle-mode" switching, wherein the two coupled free magnetic layers are flipped through a carefully controlled (timed) application of write fields in two axes. The timing of the write fields allows a scissoring-action to take place to switch the devices.

An example of a toggle-mode MRAM device 200 is illustrated in FIGS. 2(a) and 2(b). As is shown, the free layer 102 is now a combination of three films: a ferromagnetic bottom free layer 202 (layer 1b), a nonmagnetic coupling layer 204, and a ferromagnetic top free layer 206 (layer 1a). It should be noted that the coupling due to layer 204 could be zero. The coupling layer 204 and dipole fields of layers 1a and 1b force the two layers to be antiparallel during steady-state operation. A carefully-timed sequence of write fields cants the magnetization in the two ferromagnetic free layers, eventually scissoring them so they switch direction. The low-resistance state of FIG. 2(a) illustrates the layer 1b magnetization parallel to the reference layer 106 (layer 2) magnetization, while the high-resistance state of FIG. 2(b) illustrates these two magnetizations as antiparallel.

Again, one advantage of the more complex toggle-mode free layer is the ability to use carefully-timed write fields to rotate the magnetization direction in the free layer. FIG. 3 illustrates a timing diagram and corresponding direction of magnetization for an exemplary operation of a write cycle applied to a toggle-mode MRAM device. In the X-Y graphs at the bottom portion of FIG. 3, the dashed vector indicates the net magnetization of the ferromagnetic bottom free layer 202, while the solid vector indicates the net magnetization of the ferromagnetic top free layer 206.

The toggle mode of switching shown in FIG. 3 may also be represented by the graph of FIG. 4(a), which depicts a path drawn on an X-Y write field graph representing the sequential application of magnetic fields used to switch a toggle-mode device from one state to another. Beginning at the origin, a field is applied in the Y-direction, followed by a field in the X direction. The field in the Y-direction is then removed while the X-direction field is maintained. Finally, the X-direction field is removed, thus completing the loop back to the origin as shown. It will be appreciated that this loop must be traversed such that the "spin-flop" point 402 of the device is enclosed inside the loop. The spin-flop point is located at a position in the X-Y plane determined by the characteristics of the free layers (e.g., film magnetization, intrinsic magnetic anisotropy, coupling strength, etc.) and the embedding environment (external magnetic fields). Additional information regarding the determination of spin-flop point location may be found in the publication of D. Worledge, "Spin Flop Switching for Magnetic Random Access Memory," *Applied Physics Letters*, 84, pp. 4559–4561, 2004, the contents of which are incorporated herein by reference in their entirety.

Although the toggle mode of MRAM writing has better scaling characteristics than conventional devices, it stands to reason that if the MRAM device could be fabricated in a manner such that the origin of the bit and word fields is shifted closer to the spin-flop point 402 as shown in FIG. 4(b), then reductions in applied power can be attained as shown by the tighter loop of FIG. 4(c). Conversely, in the plane of bit and word fields, the location of the spin-flop point is moved closer to the origin. In this regard, it has been discovered that by applying a background magnetic field at 45 degrees with respect to the X and Y write fields, the spin flop point can in fact be moved towards the origin of the bit and word fields. Accordingly, one aspect of the invention embodiments presented herein effectively implements the application of a background magnetic field so that the power needed to operate the devices can be reduced.

It has further been discovered that the well balanced free layers of a toggle mode MRAM device couple so tightly that their state is relatively immune to external fields. As such, a shift in the spin-flop point is the only significant effect on the coupled free layers, for moderately sized fields. As a result, it is possible to physically separate a pinned layer from the reference layer for added benefits in terms of manufacturability and thermal stability. In other words, moving the pinned layer away from the sensitive tunnel barrier, the diffusion of manganese antiferromagnet material used in the pinned layer may be inhibited, thus allowing the tunnel barrier to survive higher temperature processing. Similar manufacturability benefits may be achieved by removing the noble metal-like antiferromagnet to a location where its galvanic properties do not enhance corrosion of the sensitive device films. Additional information concerning the use of a simplified stack with an offset background magnetic field may be found in Ser. No. 10/905,551, filed concurrently herewith, and the contents of which are incorporated herein by reference in their entirety.

FIG. 5 schematically illustrates the coupling of the reference layer 106 to an external field 502. Because the reference layer 106 (layer 2) couples strongly to external fields, it will align parallel thereto. It should also be noted that only positive bit and word fields are applied during the write operation. For a strong enough external field, the reference layer 106 will also stay in this fixed position during any read operations, and even if the reference layer magnetization direction fluctuates during write operations (i.e., when other fields are applied to the device), it will stabilize in the position aligned with field 502 when the read operation takes place. In contrast, the free layer 102 (layers 1a and 1b) does not align parallel to the external field 502 since the layers primarily couple internally therebetween.

In accordance with an embodiment of the present invention, suitable magnitudes of external field may be chosen such that the reference layer is properly aligned during read operations, and such that the spin-flop point is advantageously shifted toward the origin as represented in the graphs of FIG. 4. As a result, the reduced power operation of the MRAM devices may be achieved using offset fields, simultaneously with the increased manufacturability of devices having a pinned layer disposed at a distance with respect to a tunnel barrier. This dual benefit is further realized through a practical means of fabricating such structures to enable incorporation of offset fields with separate pinned and reference layers.

Figure 6:
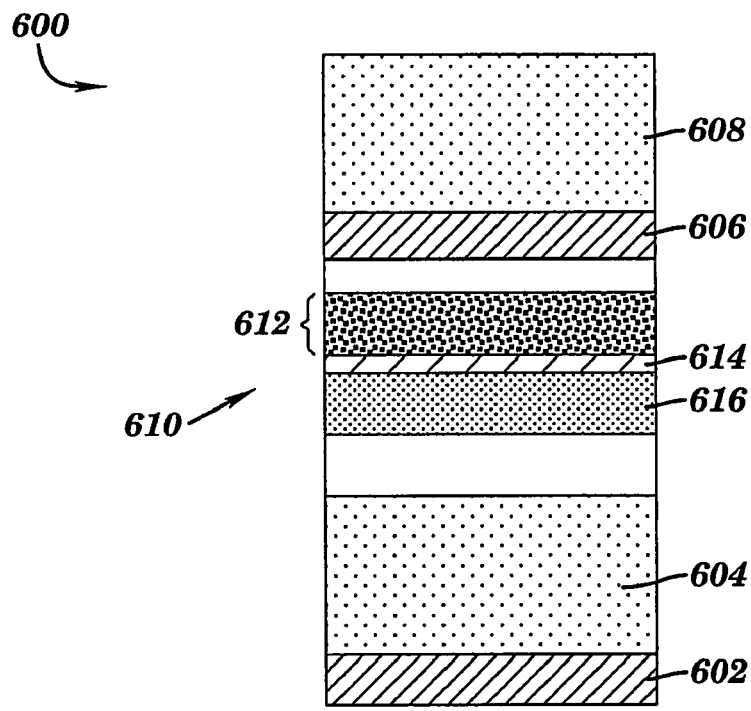
FIG. 6 is a cross sectional view of an MRAM structure formed in accordance with an embodiment of the invention.

Referring now to FIG. 6, there is shown a cross sectional view of an MRAM structure 600 formed in accordance with an embodiment of the invention. As is shown, the structure 600 includes a first pinned layer 602 formed beneath and in conjunction with a first conductive line (e.g., wordline 604) and a second pinned layer 606 formed beneath and in conjunction with a second conductive line (e.g., bitline 608). It will be noted that for purposes of clarity, the bitline 608 and second pinned layer 606 is shown rotated 90 degrees, since the wordline 604 is nominally orthogonal with respect to the bitline 608. A toggle mode MRAM cell 610 is disposed between the wordline 604 and bitline 608, and includes an antiparallel free layer stack 612 (e.g., as shown in FIG. 2), a tunnel barrier 614 and a reference layer 616. It will be noted that both the first pinned layer 602 and the second pinned layer 606 (being integrated with the wordline 604 and bitline 608 formation, respectively) are physically separated from reference layer 616, thus resulting in greater flexibility for the selection of materials used in the formation thereof. As described in further detail later, the trench created in the formation of the wordline 604 optionally includes a liner material 618.

Generally, the pinned layers 602, 606 may be fabricated from antiferromagnetically-pinned ferromagnetic or ferrimagnetic materials or, alternatively, from intrinsically high coercivity ($H_c$) ferromagnetic or ferromagnetic materials. The thicknesses and magnetic properties of such materials may be chosen for desired field strength. In either case, the addition of the pinned layer materials is easily integrated into the process following the trench definition of the wordline and bitline structures. Where antiferromagnetic material is used in the formation of the pinned layers 602, 606, the setting of the pinning of the same may be implemented in a single set step following the deposition of the last antiferromagnetic layer. In one embodiment, each of the pinned layers is set in a field aligned with the axis of intrinsic anisotropy of the antiparallel free layer stack 612. In particular, a set step may be implemented in any suitable method in the art (e.g., for PtMn antiferromagnets, a 300° C., 1 hour anneal in a 1 T magnetic field). A similar approach may be used to set the direction of magnetization of high coercivity ($H_c$) pinned layers, but alternatives can also be used, such as setting the direction by depositing the films in a magnetic field. With high $H_c$ pinned layers, the magnetization of the bit and word pinned lines need not be aligned in the same direction (i.e., aligned with the intrinsic anisotropy of the antiparallel free layer stack 612), but can (using the layers of different coercivities) align each layer separately and preferably orthogonal to the long axis of the wire in which the film resides.

Figure 7:
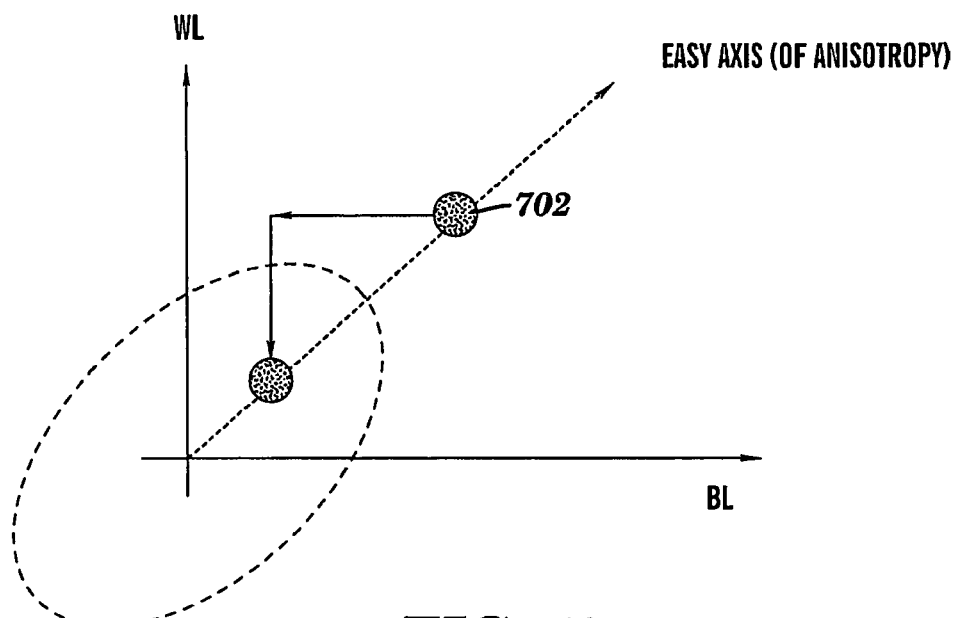
FIG. 7 is a graph illustrating a shift in the original spin-flop point of the MRAM device of FIG. 6 as a result of the net offset field generated by the pinned layers thereof.

In addition to the ease of integration, the formation and setting of the pinned layers 602, 606 results in an offset external field that advantageously shifts the spin-flop point for reduced power writing. As depicted in the graph of FIG. 7, the original spin-flop point 702 is shifted in the bitline x-axis) direction by the offset field generated by pinned layer 602, and simultaneously shifted in the wordline (y-axis) direction by the offset field generated by pinned layer 606. The superposition of the offset fields thus results in a net shift along (about) the 45 degree axis, toward the origin of the graph. The elliptical dashed-line figure is representative of a tunnel junction device with shape anisotropy and intrinsic anisotropy along the 45 degree axis. The intrinsic anisotropy is largely tied to the shift of the spin-flop point, whereas the shape anisotropy is useful for maintaining the reference layer in the preferred direction during read operations.

Figure 8:
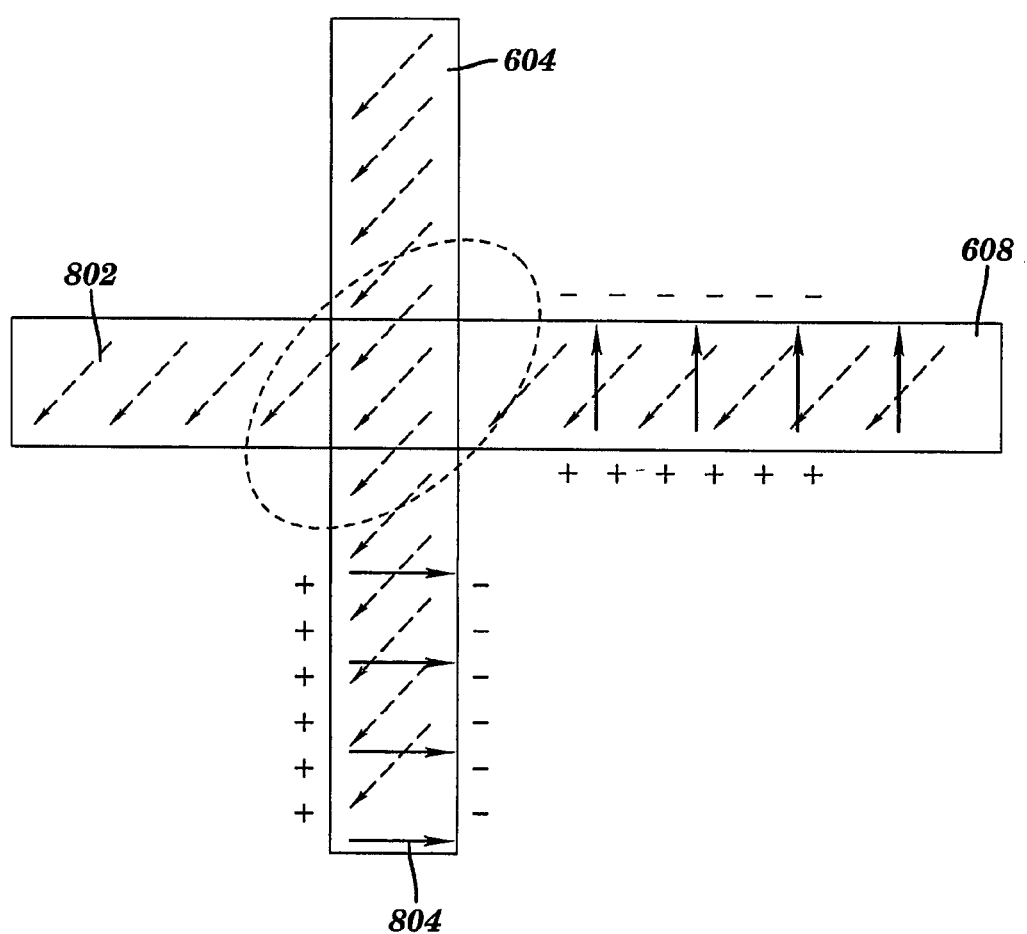
FIG. 8 illustrates an example of the pinned layer magnetization orientation along the wordline and bitline axes when using antiferromagnetic materials for the pinned layers.

FIG. 8 further illustrates the effect of setting magnetization of the pinned layers 602, 606 in a single step parallel to the intrinsic anisotropy of the antiparallel free layer stack 612, wherein the net superposed magnetization approximately equidistant between pinned layers 602 and 606 is in the same direction as the intrinsic anisotropy of the antiparallel free layer stack 612. The dashed arrows 802 represent the pinned layer magnetization, and the + and − symbols represent the magnetic "poles." However, due to the geometry of the wordline and bitline wires, the resulting external field generated therefrom (i.e., the demagnetization field) will generally be perpendicular to the long axis of the wires, as represented by the solid arrows 804. Furthermore, the superposition of the demagnetization fields of the wordline 604 and bitline 608 results in a net offset field at the tunnel barrier of about 45 degrees.

The actual angle of offset field will be determined by the distance of the tunnel barrier from each of the pinned films, by the wire widths, and by the relative magnetization in each of the pinned films. The direction of the offset field may be chosen along the 45 degree line of device anisotropy, but may be chosen along a different direction to take advantage of circuit biases that favor switching with asymmetric bitline and wordline fields. To reduce total device operating power, the shift in spin-flop point should reduce the distance between the origin and the spin-flop point, irrespective of which direction the spin-flop point is shifted. It will further be noted that for the setting of pinned layer magnetization along the 45 degree axis, at each of the long ends of the wordline 604 and bitline 608, there will be a field component parallel to the long axis of the wires. However, this component is insufficient to affect the tunnel junctions for realistic lengths of wordlines and bitlines.

On the other hand, where intrinsically high $H_c$ materials are used in place of antiferromagnetic pinned layers, there is additional flexibility in terms of how the "set" step may be carried out. For instance, the setting of the pinned layers may be done at the same time for both pinned layers, similar to the process described above for antiferromagnetic pinned layers. Alternatively, the set step for intrinsically high $H_c$ pinned layers can be implemented separately for each pinned layer by applying a high magnetic field without thermal treatment, or by applying a moderate magnetic field during the deposition of the high $H_c$ film. This approach allows for flexibility in the direction of magnetization of the pinned layers, since the absence of a thermal step helps to minimize impact on intrinsic anisotropies of previously oriented layers that may exist in the circuit.

Figure 9:
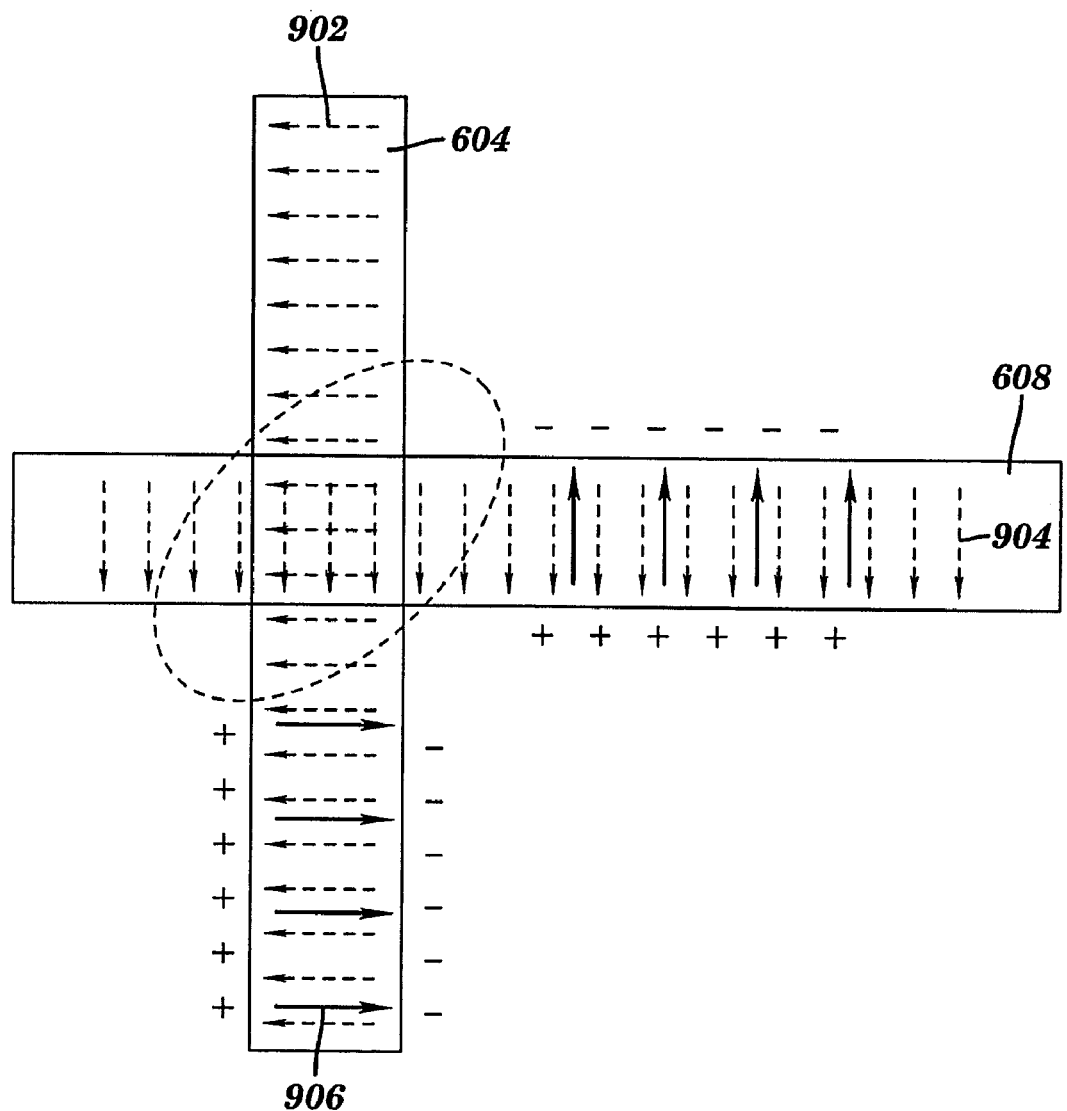
FIG. 9 illustrates an example of the pinned layer magnetization orientation along the wordline and bitline axes when using intrinsically high $H_c$ materials for the pinned layers.

An example of the pinned layer magnetization orientation when using intrinsically high $H_c$ materials is shown in FIG. 9. As can be seen the pinned layer magnetization for the wordline 604 is set orthogonal to the long axis thereto (as indicated by arrows 902), while the pinned layer magnetization for the bitline 608 is set orthogonal to the long axis thereto (as indicated by arrows 904). As is the case with the antiferromagnetic material pinned layers, the external demagnetization fields generated by the pinned layers are still perpendicular to the long axis of the wordline and bitline wires, as indicated by solid arrows 906. Thus, the superposition of the demagnetization fields again results in a net offset field with respect to the tunnel junction at about 45 degrees. Further, because the pinned layer magnetization directions are perpendicular to the long axes, there is even less of a distorting effect from parallel demagnetization fields at the ends of the wordline and bitline.

In another embodiment, it is further contemplated that both antiferromagnetic pinned layers and intrinsically high $H_c$ materials can be used in the same device. For example, one of the pinned layers may be an antiferromagnetic pinned layer (i.e., set at a high temperature/high field), while the other pinned layer is an intrinsically high $H_c$ layer (set at high field only) to allow the two pinned layers to be oriented in non-parallel directions. In still another embodiment, antiferromagnetic pinning with different materials (e.g., having different blocking temperatures) can also be used to establish differing magnetization orientations.

Regardless of the material selection and setting steps implementing in forming the pinning layers, the embodiments described herein further provide a mechanism for facilitating that the resulting generated offset field is felt by the antiparallel free layer 612 and reference layer 616, rather than being shunted into adjacent pinned layers. Typical MRAM device layouts will space the bit and word lines far enough apart that the demagnetization field is substantially felt by the free and reference layers 612 and 616. In this respect, the bitline pinned layer 606 is located at the bottom of the bitline trench for simplest manufacturability, and is therefore located relatively close to the tunnel barrier 614. On the other hand, the wordline pinned layer 602 could be located at the top of the wordline wire 604, using similar reasoning, but may be more difficult to manufacture (for example, requiring a copper recess step followed by pinned layer deposition and CMP patterning). As a result, a preferred approach is to locate the wordline pinned layer 602 at the bottom of the wordline trench.

Additional information regarding the formation of pinned layers, having an associated liner material, inside trenches may be found in U.S. application Ser. No. 10/710,044, Filed Jun. 15, 2004, and assigned to the assignee of the present application, the contents of which are incorporated herein in their entirety. Generally, a ferromagnet is deposited at the base of a trench using directional deposition methods known in the art. An antiferromagnetic pinning layer is deposited primarily at the base of the trench using similar methods, either just before or just after the ferromagnet. An anneal in a magnetic field is used to set the proper coupling and magnetization direction, and negates the effect of any antiferromagnet which may reside on the sidewalls. Alternatively, high $H_c$ materials can be directionally deposited to reside in the bottom of the trench, and deposition in a field, anneal/magnetic field combination, or a field alone can be used to set the magnetization direction.

Figure 10:
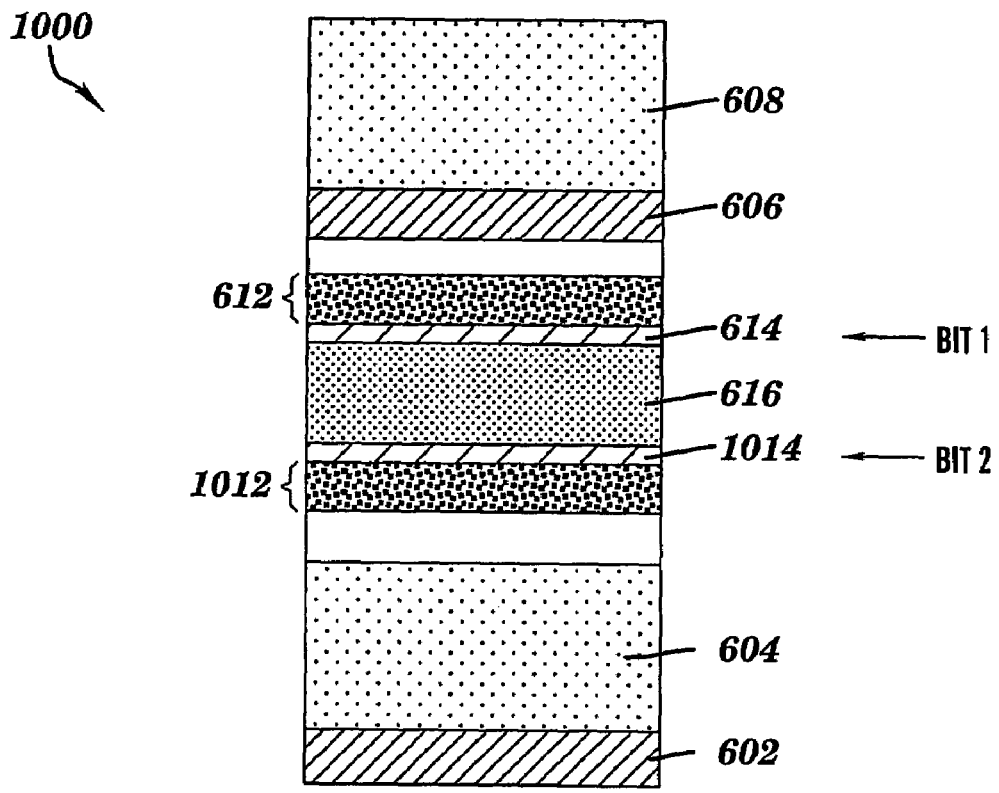
FIG. 10 is a cross sectional view of a 2-bit per cell MRAM structure formed in accordance with an alternative embodiment of the invention.

FIG. 10 is a cross sectional view of an alternative embodiment of an MRAM structure 1000, characterized by a 2-tunnel junction device for 2-bit storage. As is the case with the embodiment 600 of FIG. 6, MRAM structure 1000 includes pinned layer 602 formed beneath and in conjunction with wordline 604, and pinned layer 606 formed beneath and in conjunction with bitline 608. However, in addition to tunnel barrier 614 and antiparallel free layer stack 612, the reference layer 616 is formed at an increased thickness to also form a second tunnel junction device with a second antiparallel free layer stack 1012 and a second tunnel barrier 1014. Both the first pinned layer 602 and the second pinned layer 606 are still physically separated from the reference layer 616, to maintain flexibility in the selection of materials used in the formation thereof.

Figure 11:
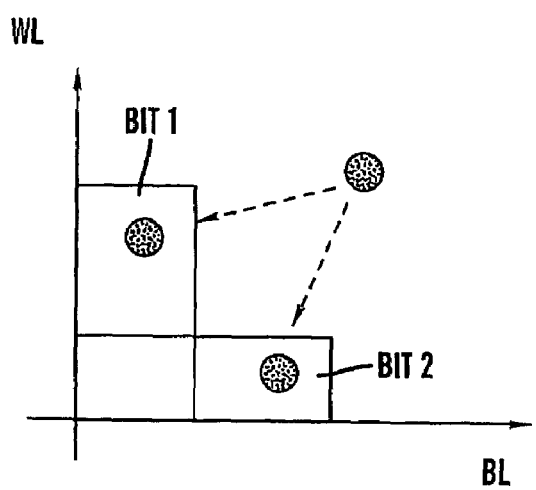
FIG. 11 is a graph illustrating a possible shift in the original spin-flop points of individual bits of the MRAM device of FIG. 10, with two toggle boxes similar to those shown in FIG. 4, and with each box enclosing a single spin-flop point.

For the structure 1000 of FIG. 10, the direction the spin-flop point will be shifted depends on how close the antiparallel free layer stacks 612, 1012 are positioned with respect to the pinned layers 606, 602. In a multiple bit storage element, therefore, the proximity of a free layer stack to a respective pinned layer can be use to separate the toggle boxes for each bit. That is, a first bit will require a larger field in one direction (e.g., the bitline direction) to switch the state of the bit, while the second bit will require a larger field in the other direction (e.g., the wordline direction) to switch its state. This is depicted by the graph of FIG. 11, which illustrates separate toggle paths for the two bits per cell. Because Bit 1 is physically closer to the bitline, less current in the bitline is needed for a write operation. In contrast, because Bit 2 is physically closer to the wordline, less current in the wordline is needed for a write operation. Therefore, the two bits may be independently written in the one cell by tailoring the write field toggle boxes to enclose only one of the spin-flop points. This 2-bit cell can be extended to enable even more bits per cell, thus dramatically increasing the density of the memory for cost savings and performance improvement.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for generating an offset field for a magnetic random access memory (MRAM) device, the method comprising:
forming a first pinned layer integrally with a wordline, wherein said first pinned layer is formed at the bottom of a trench used to define said wordline;
forming a second pinned layer integrally with a bitline;
disposing an MRAM cell between said wordline and said bitline, said MRAM cell including a reference layer, an antiparallel free layer, and a tunnel barrier therebetween;
wherein said first pinned layer is formed with an internal magnetization in a manner so as to create a first external field generally perpendicular to a long axis of said wordline, and said second pinned layer is formed with an internal magnetization in a manner so as to create a second external field generally perpendicular to a long axis of said bitline.

2. The method of claim 1, wherein said first and said second pinned layers are formed using antiferromagnets coupled to ferromagnets.

3. The method of claim 2, wherein said internal magnetization of said first pinned layer and said internal magnetization of said second pinned layer are oriented in alignment with an intrinsic axis of anisotropy of said antiparallel free layer.

4. The method of claim 3, wherein said internal magnetization of said first pinned layer and said internal magnetization of said second pinned layer are set simultaneously.

5. The method of claim 1, wherein said first and said second pinned layers are formed using intrinsically high coercivity ($H_c$) materials.

6. The method of claim 5, wherein said internal magnetization of said first pinned layer and said internal magnetization of said second pinned layer are oriented in alignment with an intrinsic axis of anisotropy of said antiparallel free layer.

7. The method of claim 6, wherein said internal magnetization of said first pinned layer and said internal magnetization of said second pinned layer are set simultaneously.

8. The method of claim 5, wherein said internal magnetization of said first pinned layer is oriented generally perpendicular to said long axis of said wordline, and said internal magnetization of said second pinned layer is oriented generally perpendicular to said long axis of said bitline.

9. The method of claim 1, wherein one said first and said second pinned layers is formed using antiferromagnet-coupled ferromagnet materials, and the other of said first and said second pinned layers is formed using intrinsically high coercivity ($H_c$) materials.

10. The method of claim 1, wherein said MRAM cell is disposed in a location between said first pinned layer and said second pinned layer such that a net offset field at said location, with respect to said first and second external fields, is aligned substantially along an intrinsic axis of anisotropy of said antiparallel free layer.

11. The method of claim 1, wherein said second pinned layer is formed at the bottom of a trench used to define said bitline.

12. The method of claim 1, wherein said MRAM cell further comprises a 2-bit storage cell having said reference layer, said antiparallel free layer and said tunnel barrier configured to store a first bit, and a second antiparallel free layer, a second tunnel barrier, and said reference layer configured to store a second bit.

13. The method of claim 1, wherein said MRAM cell is disposed in a location between said first pinned layer and said second pinned layer such that a net offset field at said location, with respect to said first and second external fields, is aligned in a manner so as to be biased toward one of the long axes of said wordline and said bitline.

14. A method for generating an offset field for a magnetic random access memory (MRAM) device, the method comprising:
forming a first pinned layer integrally with a wordline;
forming a second pinned layer integrally with a bitline, said first and said second pinned layers formed using intrinsically high coercivity ($H_c$) materials;
disposing an MRAM cell between said wordline and said bitline, said MRAM cell including a reference layer, an antiparallel free layer, and a tunnel barrier therebetween;
wherein said first pinned layer is formed with an internal magnetization in a manner so as to create a first external field generally perpendicular to a long axis of said wordline, and said second pinned layer is formed with an internal magnetization in a manner so as to create a second external field generally perpendicular to a long axis of said bitline;
wherein said internal magnetization of said first pinned layer is oriented generally perpendicular to said long axis of said wordline, and said internal magnetization of said second pinned layer is oriented generally perpendicular to said long axis of said bitline; and
wherein said internal magnetization of said first pinned layer and said internal magnetization of said second pinned layer are set sequentially in the absence of a thermal treatment.

15. A method for generating an offset field for a magnetic random access memory (MRAM) device, the method comprising:
forming a first pinned layer integrally with a wordline;
forming a second pinned layer integrally with a bitline, said first and said second pinned layers formed using antiferromagnets coupled to ferromagnets;
disposing an MRAM cell between said wordline and said bitline, said MRAM cell including a reference layer, an antiparallel free layer, and a tunnel barrier therebetween;
wherein said first pinned layer is formed with an internal magnetization in a manner so as to create a first external field generally perpendicular to a long axis of said wordline, and said second pinned layer is formed with an internal magnetization in a manner so as to create a second external field generally perpendicular to a long axis of said bitline;
wherein said internal magnetization of said first pinned layer and said internal magnetization of said second pinned layer are oriented in alignment with an intrinsic axis of anisotropy of said antiparallel free layer, and wherein:
said internal magnetization of said first pinned layer and said internal magnetization of said second pinned layer are set sequentially;
said internal magnetization of said first pinned layer is oriented generally perpendicular to said long axis of said wordline, and said internal magnetization of said second pinned layer is oriented generally perpendicular to said long axis of said bitline; and said internal magnetization of said first pinned layer is set at a different temperature than for said internal magnetization of said second pinned layer, using respective antiferromagnets having different blocking temperatures.

16. A method for generating an offset field for a magnetic random access memory (MRAM) device, the method comprising:

forming a first pinned layer integrally with a wordline;
forming a second pinned layer integrally with a bitline;
disposing an MRAM cell between said wordline and said bitline, said MRAM cell including a reference layer, an antiparallel free layer, and a tunnel barrier therebetween;
wherein said first pinned layer is formed with an internal magnetization in a manner so as to create a first external field generally perpendicular to a long axis of said wordline, and said second pinned layer is formed with an internal magnetization in a manner so as to create a second external field generally perpendicular to a long axis of said bitline;
wherein one of said first and said second pinned layers is formed using antiferromagnet-coupled ferromagnet materials, and the other of said first and said second pinned layers is formed using intrinsically high coercivity ($H_c$) materials; and
wherein the antiferromagnet-coupled ferromagnet pinned layer is set by thermal treatment in a magnetic field, and the high coercivity pinned layer is set by magnetic field alone.

17. A magnetic random access memory (MRAM) device, comprising:

a first pinned layer integrally formed with a wordline, wherein said first pinned layer is formed at the bottom of a trench used to define said wordline;
a second pinned layer integrally formed with a bitline;
an MRAM cell disposed between said wordline and said bitline, said MRAM cell including a reference layer, an antiparallel free layer, and a tunnel barrier therebetween;
wherein said first pinned layer is formed with an internal magnetization in a manner so as to create a first external field generally perpendicular to a long axis of said wordline, and said second pinned layer is formed with an internal magnetization in a manner so as to create a second external field generally perpendicular to a long axis of said bitline.

18. The MRAM device of claim 17, wherein said first and said second pinned layers are formed using antiferromagnets coupled to ferromagnets.

19. The MRAM device of claim 18, wherein said internal magnetization of said first pinned layer and said internal magnetization of said second pinned layer are oriented in alignment with an intrinsic axis of anisotropy of said antiparallel free layer.

20. The MRAM device of claim 17, wherein said first and said second pinned layers are formed using intrinsically high coercivity ($H_c$) materials.

21. The MRAM device of claim 20, wherein said internal magnetization of said first pinned layer is oriented generally perpendicular to said long axis of said wordline, and said internal magnetization of said second pinned layer is oriented generally perpendicular to said long axis of said bitline.

22. The MRAM device of claim 17, wherein one said first and said second pinned layers is formed using antiferromagnetic materials, and the other of said first and said second pinned layers is formed using intrinsically high coercivity ($H_c$) materials.

23. The MRAM device of claim 17, wherein said MRAM cell is disposed in a location between said first pinned layer and said second pinned layer such that a net offset field at said location, with respect to said first and second external fields, is aligned substantially along an intrinsic axis of anisotropy of said antiparallel free layer.

24. The MRAM device of claim 17, wherein said second pinned layer is formed at the bottom of a trench used to define said bitline.

25. The MRAM device of claim 17, wherein said MRAM cell further comprises a 2-bit storage cell having said reference layer, said antiparallel free layer and said tunnel barrier configured to store a first bit, and a second antiparallel free layer, a second tunnel barrier, and said reference layer configured to store a second bit.

26. The MRAM device of claim 17, wherein said MRAM cell is disposed in a location between said first pinned layer and said second pinned layer such that a net offset field at said location, with respect to said first and second external fields, is aligned in a manner so as to be biased toward one of the long axes of said wordline and said bitline.

* * * * *